(12) United States Patent
Liu et al.

(10) Patent No.: US 11,658,461 B1
(45) Date of Patent: May 23, 2023

(54) TUNING THE OUTPUT OF A LASER

(71) Applicant: Quantum Valley Ideas Laboratories, Waterloo (CA)

(72) Inventors: Chang Liu, Waterloo (CA); Kent Arnold Nickerson, Waterloo (CA); Mojtaba Hajialamdari, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 18/150,110

(22) Filed: Jan. 4, 2023

Related U.S. Application Data

(60) Provisional application No. 63/324,740, filed on Mar. 29, 2022.

(51) Int. Cl.
  *H01S 5/0687* (2006.01)
  *H01S 5/065* (2006.01)
  *H01S 5/00* (2006.01)

(52) U.S. Cl.
  CPC .......... *H01S 5/0687* (2013.01); *H01S 5/0085* (2013.01); *H01S 5/065* (2013.01)

(58) Field of Classification Search
  CPC ...................................................... H01S 5/065
  USPC ............................................................ 372/18
  See application file for complete search history.

(56) References Cited

U.S. PATENT DOCUMENTS

| | | | |
|---|---|---|---|
| 10,038,301 B1 * | 7/2018 | Eggleston | ............. H01S 5/1092 |
| 10,509,065 B1 | 12/2019 | Shaffer | |
| 10,564,201 B1 | 2/2020 | Shaffer | |
| 10,802,066 B1 | 10/2020 | Keaveney et al. | |
| 11,137,487 B1 | 10/2021 | Amarloo et al. | |
| 11,209,473 B2 | 12/2021 | Amarloo et al. | |
| 2013/0050795 A1 * | 2/2013 | Qiu | ....................... G02F 1/3536 |
| | | | 359/238 |

(Continued)

OTHER PUBLICATIONS

Dutta, et al., "Mode-hop-free tuning over 135 GHz of external cavity diode lasers without anti-reflection coating", Applied Physics B, 106, 2012, 6 pgs.

(Continued)

*Primary Examiner* — Tuan N Nguyen
(74) *Attorney, Agent, or Firm* — Henry Patent Law Firm PLLC

(57) ABSTRACT

In a general aspect, a laser system includes a laser and a frequency comb generator system. The laser is configured to generate a laser signal, and the frequency comb generator system is configured to generate a frequency comb based on the laser signal. The frequency comb includes frequency comb signals at respective comb frequencies. The laser system also includes a frequency comb dispersion system configured to spatially separate the frequency comb signals onto respective optical channels of the frequency comb dispersion system. The laser system additionally includes a frequency selector system configured to generate a selected frequency signal from the frequency comb signals after separation. The selected frequency signal includes a target separated frequency comb signal. The laser system also includes a frequency shifter configured to alter the selected frequency signal toward a target output frequency of the laser system.

30 Claims, 10 Drawing Sheets

(56) References Cited

U.S. PATENT DOCUMENTS

2015/0372447 A1* 12/2015 Song ............... H01S 3/0057 372/21

OTHER PUBLICATIONS

Fan, et al., "Atom based RF electric field sensing". Journal of Physics B: Atomic, Molecular and Optical Physics, Sep. 9, 2015, 17 pgs.

Fortier, et al., "20 years of developments in optical frequency comb technology and applications", Communications Physics, Dec. 6, 2019, 16 pgs.

Gagliardi, et al., "Sub-Doppler spectroscopy of H2 18O at 1.4um", App. Phys. B 70, Mar. 24, 2020, 6 pgs.

Geng, et al., "Photonic integrated circuit implementation of a sub-GHz-selectivity frequency comb filter for optical clock multiplication", Optics Express 25, Oct. 30, 2017, 11 pgs.

Hasan, et al., "Integrated optical SSB modulation / frequency shifting using cascaded silicon MZM", IEEE Photonics Technology Letters, 2020, 5 pgs.

Holzwarth, et al., "Optical Clockworks and the Measurement of Laser Frequencies With a Mode-Locked Frequency Comb", IEEE J. of Quantum Electronics 37, Dec. 2001, 9 pgs.

Ji, et al., "Exploiting Ultralow Loss Multimode Waveguides for Broadband Frequency Combs", Laser & Photonics Reviews 15, 2000353, 2021, 14 pgs.

Jin, et al., "Piezoelectrically tuned silicon nitride ring resonator", Optics Express 26, Feb. 5, 2018, 14 pgs.

Metcalf, et al., "Stand-Alone High-Power Broadly Tunable Optoelectronic Frequency Comb Generator", OFC/NFOEC Technical Digest, JW2A. 15, 2013, 3.

Saliba, et al., "Mode stability of external cavity diode lasers", Applied Optics, 48, Dec. 10, 2009, 11.

Schwettmann, et al., "Field-programmable gate array based locking circuit for external cavity diode laser frequency stabilization", Rev.Sci.Instrum 82, Oct. 7, 2011, 7 pgs.

Sedlacek, et al., "Atom-Based Vector Microwave Electrometry Using Ribidium Rydberg Atoms in a Vapor Cell", Physical Review Letters, Aug. 6, 2013, 5 pgs.

Sedlacek, et al., "Microwave electrometry with Rydberg atoms in a vapour cell using bright atomic resonances", Nature Physics 8, Nov. 2012, 6 pgs.

Spencer, et al., "An optical-frequency synthesizer using integrated photonics", Nature 557, 81, May 3, 2018, 8 pgs.

Talvard, et al., "Enhancement of the performance of a fiber-based frequency comb by referencing to an acetylene-stabilized fiber laser", Optics Express, 25, 3, Feb. 6, 2017, 11.

Wu, et al., "Generation of very flat optical frequency combs from continuous-wave lasers using cascaded intensity and phase modulators driven by tailored radio frequency waveforms", Optics Letters, 35, 19, Sep. 23, 2010, 3 pgs.

Xue, et al., "Microresonator Kerr frequency combs with high conversion efficiency", Laser Photonics Rev. 11, Jan. 9, 2017, 7 pgs.

* cited by examiner

TUNING THE OUTPUT OF A LASER

CROSS-REFERENCE TO RELATED APPLICATIONS

This application claims priority to U.S. Prov. App. No. 63/324,740, which was filed on Mar. 29, 2022, and entitled, "Tuning the Output of a Laser." The disclosure of the priority application is hereby incorporated by reference in its entirety.

GOVERNMENT LICENSE RIGHTS

This invention(s) was made with U.S. government support under Sub-Contract No. 59604 to SRI International, which is under their prime agreement with the Defense Advanced Research Projects Agency (DARPA) of the Department of Defense under Contract No. HR001121C0141. The government has certain rights in the invention(s).

BACKGROUND

The following description relates to tuning the output of a laser.

Lasers can be used to output a beam of coherent light. Conventional lasers include a gain medium (e.g., a doped crystal, a chemical compound, a gas, etc.) and an external source of energy (e.g., a flash lamp, another laser, etc.) to stimulate the gain medium. The gain medium generates photons and an intensity of these photons is amplified in response to stimulation from the external source of energy. The generated photons have respective wavelengths that define a spectral bandwidth for the lasers.

DETAILED DESCRIPTION

In a general aspect, laser systems are described herein that can be agile and highly tunable. In many implementations, the laser systems are configured to generate a laser light of narrow spectral bandwidth (e.g., less than 10 MHz). The spectral bandwidth may be sufficiently narrow to address atomic and molecular lines in frequency domain spectroscopy, and in certain cases, may even be about 1 Hz. Such laser light may address atomic transitions over a broad range of frequencies and at high switching speed (e.g., a 1 MHz spectral bandwidth in 1 μs). The laser systems may include a frequency-stabilized continuous wave (CW) laser, a frequency comb, a frequency filter, an optical switch (or optical switch network), and a frequency shifter. In this configuration, the laser systems may minimize the response time required for their output to switch between different precise, target frequencies, thereby allowing fast tuning of the output.

Figure 1:
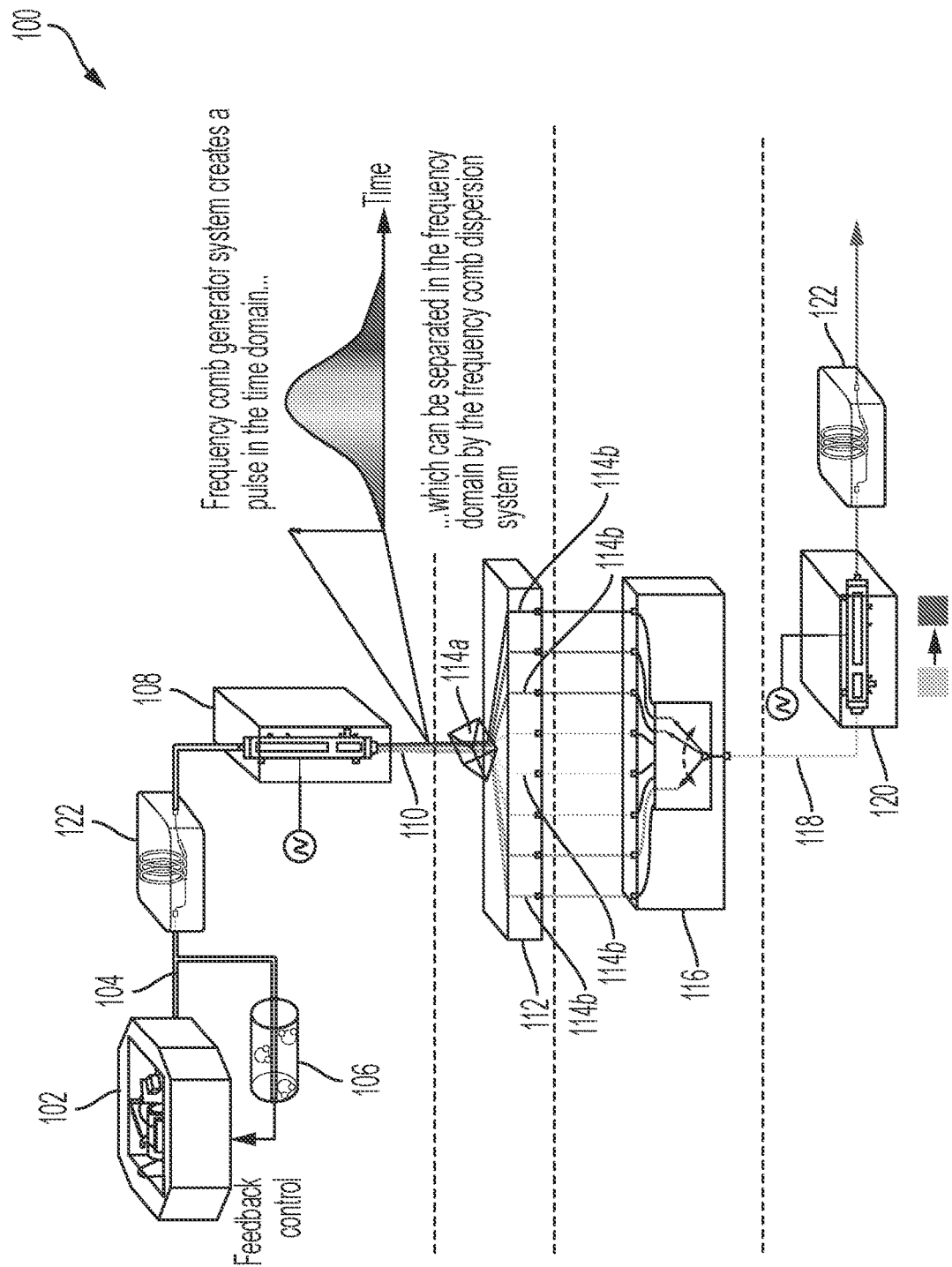
FIG. 1 is a schematic diagram of an example laser system with a tunable output.

Now referring to FIG. 1, a schematic diagram is presented of an example laser system 100 with a tunable output. The example laser system 100 includes a laser 102 configured to generate a laser signal 104. The laser 102 may, in certain instances, be continuous wave (CW) laser, and in these instances, the laser signal may be a frequency locked output of the continuous wave laser. For example, and as shown in FIG. 1, the example laser system 100 may include a vapor cell 106 having a vapor therein. The frequency locked output of the laser 102 may be based on an electronic transition of the vapor. As another example, the example laser system 100 may include an optical cavity (e.g., an interferometer), and the frequency locked output of the laser 102 may be based on an output frequency of the optical cavity, such as determined by an optical path length of the optical cavity. The output frequency may be associated with a reflected beam from the optical cavity. However, in certain cases, the output frequency is associated with a transmitted beam from the optical cavity.

The example laser system 100 also includes a frequency comb generator system 108 that is configured to generate a frequency comb based on the laser signal 102. The frequency comb includes frequency comb signals 110 (e.g., comb teeth) at respective comb frequencies. The example laser system 100 additionally includes a frequency comb dispersion system 112 configured to spatially separate the frequency comb signals 110 onto respective optical channels 114 of the frequency comb dispersion system 112. These optical channels 114 may be spatially separate from one another (e.g., be physically separated from one another by a distance). In some variations, such as shown in FIG. 1, the frequency comb dispersion system 112 includes an arrayed waveguide grating (AWG). The arrayed waveguide grating has an input optical channel 114a that receives the frequency comb signals 110 from the frequency comb generator system 108. The arrayed waveguide grating may also have a plurality of output optical channels 114b that are physically separated from one another by a distance.

The example laser system 100 also includes a frequency selector system 116 that is configured to generate a selected frequency signal 118 from the frequency comb signals 110 after separation (e.g., after separation onto the respective optical channels 114 of the frequency comb dispersion system 112). The selected frequency signal 118 includes a target separated frequency comb signal. In some instances, the target separated frequency comb signal has a comb frequency that is closest to a target output frequency of the laser system. However, other comb frequencies are possible. For example, the target separated frequency comb signal may have a comb frequency that is second closest to a target output frequency of the laser system, third closest to a target output frequency of the laser system, and so forth. The comb frequency may, in certain cases, be determined by a maximum frequency shifting capability of a frequency shifter of the laser system 100, as described further below. In some variations, the frequency selector system 116 includes a network of optical switches (e.g., a series of optical switches). In these variations, the example laser system 100 includes a control system that is configured to control the network of optical switches to select a target optical channel (e.g., of the arrayed waveguide grating) that carries the target separated frequency comb signal.

In some variations, the example laser system 100 includes a photonic integrated circuit (PIC). The photonic integrated circuit may have a network of drop-out filters and may define the frequency comb dispersion system 112. In some variations, the photonic integrated circuit further defines the frequency selector system 116. The network of drop-out filters may, for example, include a plurality of ring resonators that are associated with respective frequency comb signals of the frequency comb. Each ring resonator is configured to resonate at a ring frequency when an optical path length of the ring resonator reaches a target optical path length. The optical path length may be altered, for instance, by straining the ring resonator via a piezoelectric element or by changing a temperature of the ring resonator via a heating element. Such processes can change one or both of a dimension and an index of refraction of the optical path length. The ring frequency of the ring resonator matches the comb frequency of one of the frequency comb signals. Thus, by selectively bringing certain ring resonators into and out of resonance, the photonic integrated circuit may allow the example laser system 100 to select the comb frequency that is closest to the target output frequency of the example laser system 100.

The example laser system 100 also includes a frequency shifter 120 that is configured to alter the selected frequency signal 118 toward the target output frequency. For example, the frequency shifter 120 may be configured to alter the selected frequency signal 118 by one or both of fine-tuning the selected frequency signal 118 to the target output frequency and scanning the selected frequency signal 118 about the target output frequency. The process of fine-tuning the selected frequency signal 118 may include shifting the selected frequency signal 118 towards the target output frequency along a single direction in frequency. The process of scanning the selected frequency signal 118 may include altering the selected frequency signal 118 back and forth through a frequency range that includes the target output frequency. The frequency range of the scanning process may be larger in magnitude than that associated with the fine-tuning process.

In some variations, the frequency shifter 120 has a maximum shifting capability that determines which comb frequencies are possible for the target separated frequency comb signal. The maximum shifting capability may be based on a frequency range of the fine-tuning or scanning process. For example, the fine-tuning process may be associated with a frequency range that includes the target output frequency of the laser system therein. The comb frequencies may therefore include those also within the frequency range of the fine-tuning process. In some variations, the frequency shifter 120 includes an optical modulator that performs single sideband suppressed carrier (SSB-SC) modulation. In some variations, the comb frequencies of the frequency comb signals 110 are separated from each other by a common frequency spacing. In these variations, the frequency shifter 120 may be configured to alter the selected frequency signal 118 by a frequency magnitude no less than the common frequency spacing.

In operation, the example laser system 100 generates, by operation of the frequency comb generator system 108, a frequency comb having frequency comb signals 118 at respective comb frequencies. The frequency comb is based on the laser signal 104. The example laser system 100 also spatially separates, by operation of the frequency comb dispersion system 112, the frequency comb signals 110 onto respective optical channels 114 of the frequency comb dispersion system 112. The selected frequency signal 118 may be generated from the separated frequency comb signals by operation of the frequency selector system 116. The selected frequency signal 118 includes the target separated frequency comb signal. The example laser system 100 additionally alters the selected frequency signal 118 toward the target output frequency by operation of the frequency shifter 120.

During operation, the target output frequency may be changed to a new target output frequency and the example laser system 100 changes its output to match the new target output frequency. To do so, the example laser system 100 may include a control system. The control system may, for example, be configured to control the frequency selector system 116 (e.g., control a network of optical switches). In this configuration, the control system may instruct the frequency selector system 116 to select the target optical channel 114 that carries the target separated frequency comb signal (e.g., the frequency comb signal that is closest to the target output frequency of the example laser system 100.) However, the control system may control other components of the example laser system 100 (e.g., the laser system 102, the frequency shifter 120, etc.)

In some variations, the control system is in communication with the frequency selector system 116 and is operable to determine a difference between the target output frequency of the example laser system 100 and an updated target output frequency of the example laser system 100. In these variations, the control system is also operable to transmit a control signal to the frequency selector system 116 to generate a second selected frequency signal. The control signal is based on the difference determined by the control system, and the second selected frequency signal is generated based on the control signal. In many variations, the second selected frequency signal may have a target separated frequency comb signal that is different than that of the (first) selected frequency signal. For example, the target separated frequency comb signal of the second selected frequency signal may be closer to the updated target output frequency than that of the (first) selected frequency signal.

In implementations where the laser 102 is a CW laser, the laser 102 may be frequency locked to a stable frequency reference, such as an atomic or molecular absorption feature or an ultra-stable cavity. When locked, the laser 102 can avoid the need to re-lock when the output frequency of the example laser system 100 is changed. Moreover, in some variations, the laser 102 can have a spectral bandwidth less than 1 MHz. In some variations, the spectral bandwidth is less than 1 kHz, or possibly even less than 1 Hz. The laser 102, when locked to an absolute frequency reference, may operate analogously to an optical clock. In such an operating mode, the laser 102 does not have to be relocked to its reference when the example laser system 100 is switched between different outputs.

In some implementations, the example laser system 100 includes one or more amplifiers 122 that amplify the laser signal 104 or the selected frequency signal 118 after being altered by the frequency shifter 120. For example, the laser 102 (e.g., as a CW laser) can seed a high-power amplifier, which in turn, can be used to generate the frequency comb. The presence of the high-power amplifier, however, may depend on the desired output power and the properties of the laser 102 and the frequency comb. The frequency comb is generated with the output of the laser 102 (which itself may be amplified) and includes one or more comb lines (or frequency comb signals 118) distributed across a target frequency range. The frequency comb dispersion system 112, which can include one or more dispersive elements, is applied to spatially separate different comb lines. A desired comb line, or even subset of comb lines, with the frequency (or frequencies) closest to the target output frequency (or target set of output frequencies) may be selected using the frequency selector system 116 (e.g., by a network of optical switches or otherwise). Examples of optical switch networks include those based on electro-optic switches or MEMs-type switches.

The frequency comb dispersion system 112 and the frequency selector system 116 may, in some variations, be combined by using a network of drop-out filters on a photonic integrated circuit tuned near each comb frequency of the frequency comb. In this case, the outputs of the drop-out filters may be combined, in whole or in part. The output of the example laser system 100 can then be determined by which drop-out filters are tuned so that they are activated. Tuning of the drop-out filters can be accomplished with micro-heaters or by using piezoelectric elements. After the desired comb line (or frequency comb signal 118) has been selected, the frequency shifter 120 can be applied to quickly and precisely shift the chosen comb line to the target output frequency. In doing so, the frequency shifter 120 may be applied to fine tune the frequency of laser light outputted by the example laser system 100. In the case where multiple target output frequencies are desired, each optical channel may include a frequency shifter 120. The frequency shifter 120 can be an electro-optic modulator configured as an IQ modulator (e.g., in a Mach-Zehnder configuration), which can allow for modulation of a single sideband suppressed carrier (SSB-SC).

In some implementations, the process of fine tuning is accomplished at radio frequency. For instance, the tuning time for the example laser system 100 may be determined by relocking the radio frequency oscillator that drives the fine-tuning electro-optic modulator (e.g., the phase locked loop in the radio frequency source). Multiple sources for the fine tuning can be used to alleviate the relock time of the phase locked loop in the radio frequency source. The hopping time among different target frequencies can be reduced, often significantly, since the laser 102 does not need to be unlocked and relocked when different frequencies are chosen. This reduction can occur while maintaining a narrow spectral bandwidth. The spectral bandwidth may, in some instances, be limited by the dwell time and the time before a measurement at any frequency. For example, the spectral bandwidth may be limited by a time-bandwidth product. Here, the time-bandwidth product is defined by $\Delta v \cdot \Delta t$, where $\Delta v$ is the bandwidth in the frequency domain and $\Delta t$ is the bandwidth in the time domain (e.g., a pulse width). Fourier theory says that the magnitude of this product can be 0.44 for a transform limited Gaussian pulse. However, depending on the pulse type, other magnitudes are possible.

The output of the example laser system 100 can be amplified by an optical amplifier to the desired output power. Optical amplifiers 122 can be applied at any stage in the example laser system 100, including intermediate stages to amplify optical signals to levels suitable for the frequency comb dispersion system 112, the frequency selector system 116, and the frequency shifter 120. Moreover, each optical component of the example laser system 100 can be optically coupled through optical fibers or another type of optical waveguide. The example laser system 100 can be incorporated, for instance, in Rydberg atom-based communications or radar systems which require fast switching time (e.g., less than 1 ms) between different Rydberg atomic transitions. The example laser system 100 can also be incorporated in metrology systems so that the detection frequency of a Rydberg atom-based electric field sensing device can be changed quickly.

In a general aspect, the laser systems described herein may be part of a Rydberg atom-based sensing system. Such a system may be useful in applications where it desirable to change a sensing carrier frequency (e.g., a target RF frequency) at high speed. Examples of these applications include electronic warfare, test and measurement, and telecommunications.

In some implementations, a laser system includes an optical clock, a frequency comb, a dispersive element, optical switches, and a fine-tuning element. The frequency comb may be analogous to the frequency comb generator system described in relation to FIG. 1. Similarly, the dispersive element may be analogous to the frequency comb dispersion system, the optical switches may be analogous to the frequency selector system, and the fine-tuning element may be analogous to the frequency shifter. In these implementations, the laser system's switching speed may be determined by the switches used and the frequency relock time of a radio frequency oscillator driving the fine-tuning element. Moreover, the spectral linewidth may be determined by the spectral bandwidth of the optical clock, which can be less than 1 Hz in certain cases. Many atomic physics applications require laser light with a spectral bandwidth of less than 1 MHz. In some instances, such as when the laser system switches, its spectral bandwidth may be limited by a time bandwidth product. For example, if the switching time is 1 us then the laser system may dwell for 10 us to achieve a spectral bandwidth of 100 kHz. However, such a dwell time can be faster than the unlocking and relocking of a conventional laser. In some instances, amplifiers can be applied within the laser system or at its output to achieve the desired output power that is necessary for injection into each element of the overall system.

Figure 2:
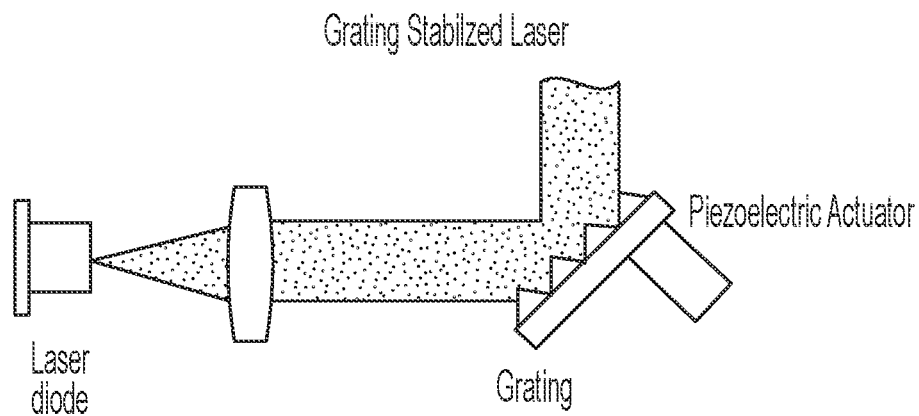
FIG. 2 is a schematic diagram of an example external cavity diode laser.
Figure 2:
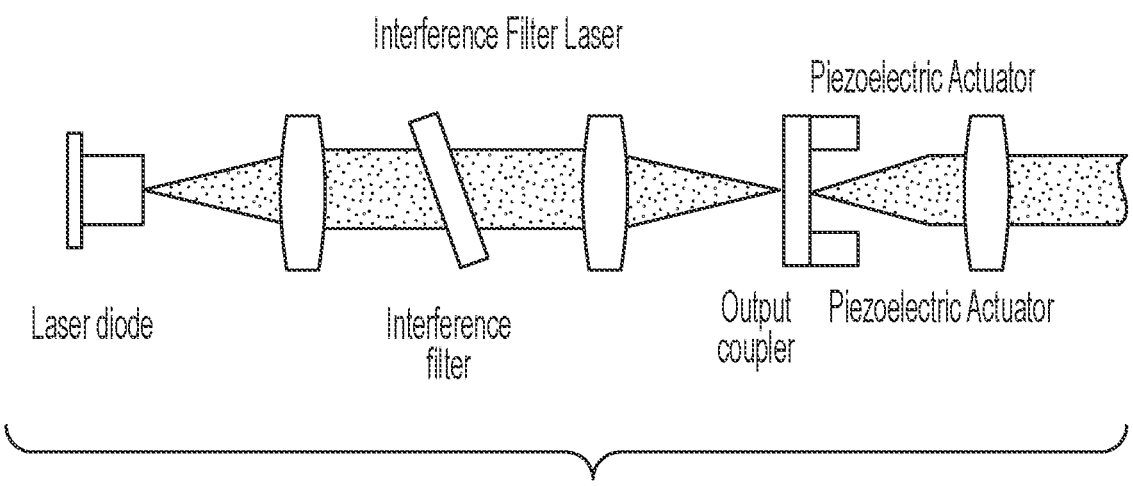

In some cases, the laser system includes a narrow-linewidth tunable laser. Narrow-linewidth tunable lasers can be constructed using external cavity diode laser (ECDL) technology, which allows for cheap and compact diode lasers capable of producing emissions in the violet to midinfrared spectral region. With optical feedback from an external cavity, the narrow-linewidth tunable laser can also be achieved using a Fabry-Perot laser and/or gain chips. In this case, the ECDL may include a laser and a wavelength selection component (such as grating or interference filter), as shown in FIG. 2. The Fabry Perot diode laser's wavelength can be coarsely tuned over its wide gain bandwidth by rotating the angle between the laser beam and the grating/interference filter. Mode hops can happen if the tuning range exceeds a free spectral range of the external cavity, which in certain cases, can be around a few GHz. However, by carefully designing the external cavity's structure or by synchronizing the amount of injection current with angle tuning, the mode-hop-free range can exceed 100 GHz. Temperature can also be used to make slow, course changes to the frequency, although large changes in frequency may require mechanically moving an element of the laser system (e.g., an optical element such as a mirror or lens).

Fluctuations in the temperature and injection current of the ECDL can cause the wavelength to drift. Meanwhile, acoustic noise and other unwanted perturbations of the laser cavity can broaden the spectral bandwidth to greater than 1 MHz, and possibly to 10 MHz. To compensate for these effects, an active feedback loop may be applied to lock the diode laser's frequency to a stable frequency reference, such as atomic or molecular transition, a Fabry-Perot cavity, or an optical frequency comb. The bandwidth of the feedback loop may be greater than 5 MHz, with about 1 MHz being possible for semiconductor lasers (e.g., ECDLs) due to their inherent noise characteristics.

The laser system, however, may include other types of lasers, such as a fiber laser, a distributed feedback (DFB) laser, or a Bragg reflector (DBR) laser. For example, fiber lasers can be thermally or piezoelectrically tuned but need to be stabilized against a reference to eliminate laser frequency fluctuations. DFB and DBR lasers can be tuned electrically or thermally but may also need to be stabilized against a reference for many applications. However, narrow spectral bandwidth lasers generally tune over nm of wavelength range slowly (at best milliseconds). Moreover, in some instances, they may need to reacquire a lock signal for frequency stabilization once they approach their new target frequency.

In variations where the narrow-linewidth tunable laser is an ECDL laser, the frequency of light produced by the ECDL may be altered by changing the temperature of the ECDL. In some variations, the frequency of light is altered by changing a current applied to a gain media (e.g., of the ECDL or a gain chip). In some variations, the frequency is altered by changing an external cavity length of the ECDL, such as via a piezoelectric transducer. Other means are possible for altering the frequency of light produced by the ECDL.

In some variations, the laser system includes a laser having an output frequency that is locked to some absolute (or approximately absolute) reference. In these variations, the laser can operate analogously to an optical clock. The absolute reference may be an interferometer (e.g., a Fabry-Perot cavity) or a molecular or atomic spectral feature. However, in certain cases, the molecular or atomic spectral feature serves as a better reference because this feature can be linked to the structure of an atom or molecule that does not change over time. Although not an optical clock, a cesium (Cs) clock is referenced to the frequency separating the two ground hyperfine states of a Cs atom (or ensemble thereof) and can be used to stabilize an optical frequency comb and the laser by using the laser-optical frequency comb beat signal. Many optical clocks use narrow bandwidth atomic or ionic transitions for their reference transitions. With such a reference transition, the laser can generate a spectroscopic signal such as an atomic absorption that can be used to frequency lock the laser. Fast electronics may then be used to generate an error signal from the atomic signal that is fed back to an actuator in the laser to correct its frequency.

In some implementations, the laser (or optical clock) is configured to measure the derivative signal of an atomic spectral line. Taking the derivative of the signal (e.g., via frequency modulated spectroscopy) can produce an electrical signal with an approximately linear slope around the spectral line peak. If the laser wanders away from its resonance, an electrical signal is produced that can be used to correct the laser's output frequency. For example, the electrical signal may be a voltage signal whose sign indicates the direction of the laser frequency error. The fundamental frequency of the laser can be tuned relative to the reference by modulating the laser—or alternatively, some fraction of its output after separating the fraction from the main laser output—to create a sideband at a desirable offset frequency and locking the sideband to the reference. The tuning can be precise since the sideband frequency is generated by a radio frequency source that can be locked to a clock, such as an ovenized (or thermally stabilized) crystal oscillator or even an atomic clock. Sub-hertz performance is possible. In many implementations of the laser system, such offset tuning is used to align the optical frequency comb to the dispersive element, such as an arrayed waveguide grating (AWG).

The optical frequency comb may be a light source that has an optical spectrum defined as equidistant spectral lines in the frequency domain. Each spectral line can be referred to as a comb tooth and may define an equal frequency spacing of modes in the optical spectrum. In this case, the optical frequency comb may be used as an optical ruler to measure unknown frequencies with the beat notes between the unknown frequency and the known comb frequencies. Such measurement may allow for the transfer of phase and frequency information from a high stability reference to thousands of comb teeth. The optical frequency comb can be used in applications such as frequency metrology, precision spectroscopy, and distance measurement. Moreover, the optical frequency comb may be capable of highly agile repetition rates. For instance, the tuning of the mode spacing in an electro-optic frequency comb can benefit from the high-frequency, large bandwidth, and highly efficient lithium niobate waveguide modulators.

Figure 3:
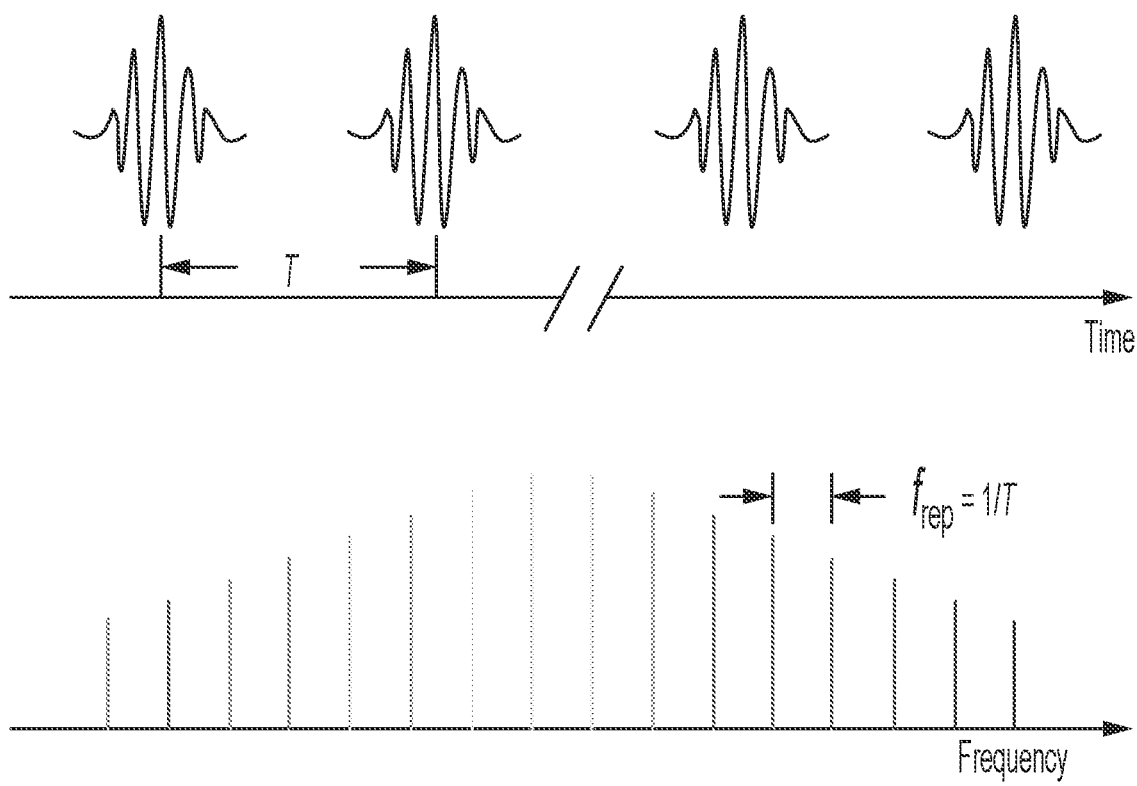
FIG. 3 is a schematic diagram of an example frequency comb generated by a mode locked laser.

The frequency comb can be generated using several different methods (e.g., by a frequency comb generator system). For example, the frequency comb may be generated using a single frequency continuous-wave laser that is strongly driven by electro-optic modulators, which impose tens of sidebands as the comb teeth. Alternatively, the frequency comb may be generated using a mode-locked laser, which can then allow for the precise measurement of oscillations from an optical atomic clock (e.g., for precise measurement of its frequency). In this case, the optical output of a mode-locked laser may be a periodic train of optical pulses with a period T, which can be expressed as a Fourier series of optical frequencies with an equal spacing $f_{rep}$ in the frequency domain. FIG. 3 shows an example frequency comb generated from a mode locked laser. As another example, the frequency comb may be generated using a micro-resonator waveguide (e.g., a so-called Kerr-type frequency comb generator). A single frequency pump source may be resonant with a micro-resonator waveguide. Moreover, the single frequency pump source may generate an output that can be converted into a frequency comb via degenerate and non-degenerate four-wave mixing processes. In another example, the frequency comb may be generated from a phase modulated single frequency laser.

The dispersive element used in the laser system may be constructed in several different ways and may be part or all of a frequency comb dispersion system. For example, one way to construct the dispersive element is to use an arrayed waveguide grating (AWG), which can also be used as a demultiplexer and/or multiplexer for optical signal processing. An AWG can be constructed as a planar light wave circuit that uses interference to separate different wavelengths of light carried in a single optical fiber into an array of optical fibers, each carrying a wavelength of light defined by the spectral bandwidth and frequency spacing of the AWG output channels.

Another optical device that provides dispersive functionality is a photonic integrated circuit that incorporates ring resonators. In the photonic integrated circuit, each ring resonator has a resonance spectral bandwidth that can be defined by engineering a Q or finesse of the ring resonator. The ring resonators may also be tuned into resonance with a specific wavelength by altering their temperature, by straining their structure with a piezoelectric, or both. When integrated into the laser system, the output from the frequency comb generator system may be coupled into the photonic integrated circuit, which has one or more different ring resonators coupled to the output channel of the frequency comb generator system. Specific wavelengths of light can be selected by tuning a particular ring resonator so that it is resonant with the target wavelength. Light captured in the ring resonator can then be coupled into an output channel of the photonic integrated circuit.

In some variations, the photonic integrated circuit can act as both the dispersive element and the switch network. Switching a ring resonator into and out of resonance with a target wavelength may be slower than what can be accomplished with an electro-optic switch. However, this configuration may be suitable in applications where a switching speed of tens of microseconds is acceptable. Moreover, a photonic integrated circuit that can directly select a frequency comb signal can provide certain advantages, such as improved stability and manufacturability. For example, the photonic integrated circuit may allow for an integrated package that reduces the number of connections between elements of the photonic integrated circuit and may also reduce the number of fiber optic cables needed for optical connections (e.g., external to the photonic integrated circuit). The photonic crystal circuit may also be amenable to mass production using processes adapted from large-scale semiconductor fabrication.

In some implementations, the switch network is based on an optical switch (or plurality thereof). The optical switch can be used to recombine the frequency comb signals, sometimes called comb teeth, and possibly also choose a particular signal or tooth. For example, the optical switch may be used to select a single comb tooth. Such selection can be done using drop-out filters that are based on MEMs, electro-optic, or photonic integrated circuits. These filters can be tuned thermally or piezoelectrically. Such selection may also be done using Fiber Bragg gratings, when tuned thermally or piezoelectrically. Electro-optic switches can provide fast (e.g., less than 10 ns) switching. Optical switches that use drop-out filters based on photonic integrated circuits can be integrated across one or more chips (e.g., silicon dies). For example, the drop-out filters can be integrated with the frequency comb generator system on one or more chips by using a Kerr-type frequency comb generated by a ring resonator. In this case, the optical switch and the dispersive element may also be integrated, thereby integrating the switch network with the dispersive element. Other types of optical switches, or optical switch trees, can be used. For some applications, lower cost and slower optical switches, even shutters, may be suitable.

To fine tune a selected comb tooth (or selected frequency signal) to a precise target frequency, the frequency shifter may include a Mach-Zehnder modulator. The spectral bandwidth of these modulators can be as high as 40 GHz, which in many instances allows them to fine-tune the comb tooth by this amount. The process of fine tuning may be done by changing the modulator frequency, which can be a radio frequency. Fine tuning may then take the problem of relocking the optical frequency and transfer it to generating the fine-tuning radio frequency. If the switching time is less than the time required to relock the radio frequency—e.g., the phase locked loop for the oscillator—then several different oscillators can be used for fine-tuning the output of the laser system, such as with a rotating (e.g., pre-programmed) frequency for the fine-tuning. The number of oscillators required may be determined by, for example, the switching time, the oscillators phase locked loop, and the dwell time required at each frequency. The Mach-Zehnder modulators may, in certain instances, act as IQ modulators so that they are capable of shifting the frequency of the output using single sideband suppressed carrier (SSB-SC) modulation. SSB-SC modulation may eliminate unwanted frequencies from the frequency output by the laser system. Improved suppression of unwanted frequencies can be achieved by using multiple Mach-Zehnder modulators (e.g., two Mach-Zehnder modulators in parallel).

The laser system may include an optical amplifier configured to amplify an optical signal from a component of the laser system. The optical signal may, for example, be produced by the laser or optical clock, the frequency comb, the optical switch, or the fine-tuning element (e.g., the modulator). In variations where the component corresponds to the frequency comb, the optical amplifier may have a broad enough spectral bandwidth to amplify an optical signal at each comb tooth of the frequency comb. The amplification may be the same for each comb tooth. In some variations, the optical amplifier may be seeded by the power of an output from the fine-tuning element. If the power of the output from the fine-tuning element is too small, then amplification at intermediate stages can be implemented. For example, the output from the frequency comb or the optical switch can be amplified to compensate for loss or lower comb tooth power. It is valuable to have enough seed power for the final amplification because if the power from the weakest fine-shifted comb tooth is above the saturation point of the amplifier, the output power can be more uniform across the entire system spectral bandwidth. In some variations, the component corresponds to a CW laser. In these variations, the optical amplifier may amplify only at the center frequency of the CW laser. This optical amplifier, in many cases, will be strong enough to increase the power per comb tooth as the amplified power can be distributed amongst many comb teeth. Examples of the optical amplifier include fiber amplifiers, semiconductor optical amplifiers, and tapered amplifiers.

In operation, a wavelength of the laser system can be tuned by adjusting an angle between the laser beam and grating (or interference filter, as shown in FIG. 2). Stability of the tuned wavelength can be achieved through active feedback from a frequency reference to an actuator in the laser (e.g., current for thermal heating/cooling, a piezoelectric element to move the grating, etc.). In order to hop among different target wavelengths, the laser system may go through the process of unlocking, wavelength tuning, and relocking. However, the time required for wavelength tuning and relocking can range from tens of milliseconds to tens of seconds, which in turn, can create performance issues for photonic sensors, especially Rydberg atom-based sensors for applications in optical communications, electronic warfare, and radar.

In some implementations, the laser system is configured for use with Rydberg atom-based sensors, which can allow the laser system to be highly tunable and stable. In this configuration, the laser system may eliminate the wavelength tuning of the laser's output. It will be appreciated that the angle tuning of the grating or interference filter may be slow, especially if such tuning is dependent on the kHz bandwidth of a piezoelectric element. Eliminating the wavelength tuning may render the process of relocking the laser unnecessary. In this case, the laser may only have to lock to a single stable reference, which improves the robustness and repeatability of the system. In these configurations, the laser system may also extend the selection range of the wavelength. For an ECDL, the tuning achievable for the wavelength may be restricted by the mode-hop-free tuning range of the ECDL. Wavelengths beyond the mode-hop-free region can be reached, but at the expense of adjusting the temperature and injection current of the ECDL, which can lead to a significant increase in the time and complexity required to achieve a new output wavelength.

In many implementations, the laser system includes a narrow bandwidth laser locked to an absolute frequency reference. In such implementations, the output of this ultra-stable laser can be amplified and used to generate a frequency comb spanning the desired wavelength range, such as by a frequency comb generator system. A dispersive element separates the comb teeth and routs them through a series of optical switches. If multiple, precise frequencies are desired, each output of the switch tree has a fine-tuning element, such as an electro-optic modulator (EOM), to shift the output frequency to a desired position. After the switch network, the frequencies are recombined into a unified output and then amplified to the desired optical output power. If a single output frequency is desired, a single fine-tuning element placed after the switch network. In some instances, the comb spacing is less than the spectral range of the fine-tuning element to ensure continuous coverage. For example, the comb frequencies of the comb teeth may be separated from each other by a common frequency spacing. As such, the fine-tuning element may be configured to alter the selected comb tooth by a frequency magnitude no less than the common frequency spacing.

During operation, the laser system outputs a highly tunable, agile, and stable laser light. The laser system may be configured to hop among different target wavelengths across tens of nanometers in less than 10 us while maintaining a spectral bandwidth of less than 1 MHz. In some variations, the laser system does not have to be relocked when changing wavelengths, which can improve the robustness of the locking and reduce the switching time.

Figure 4:
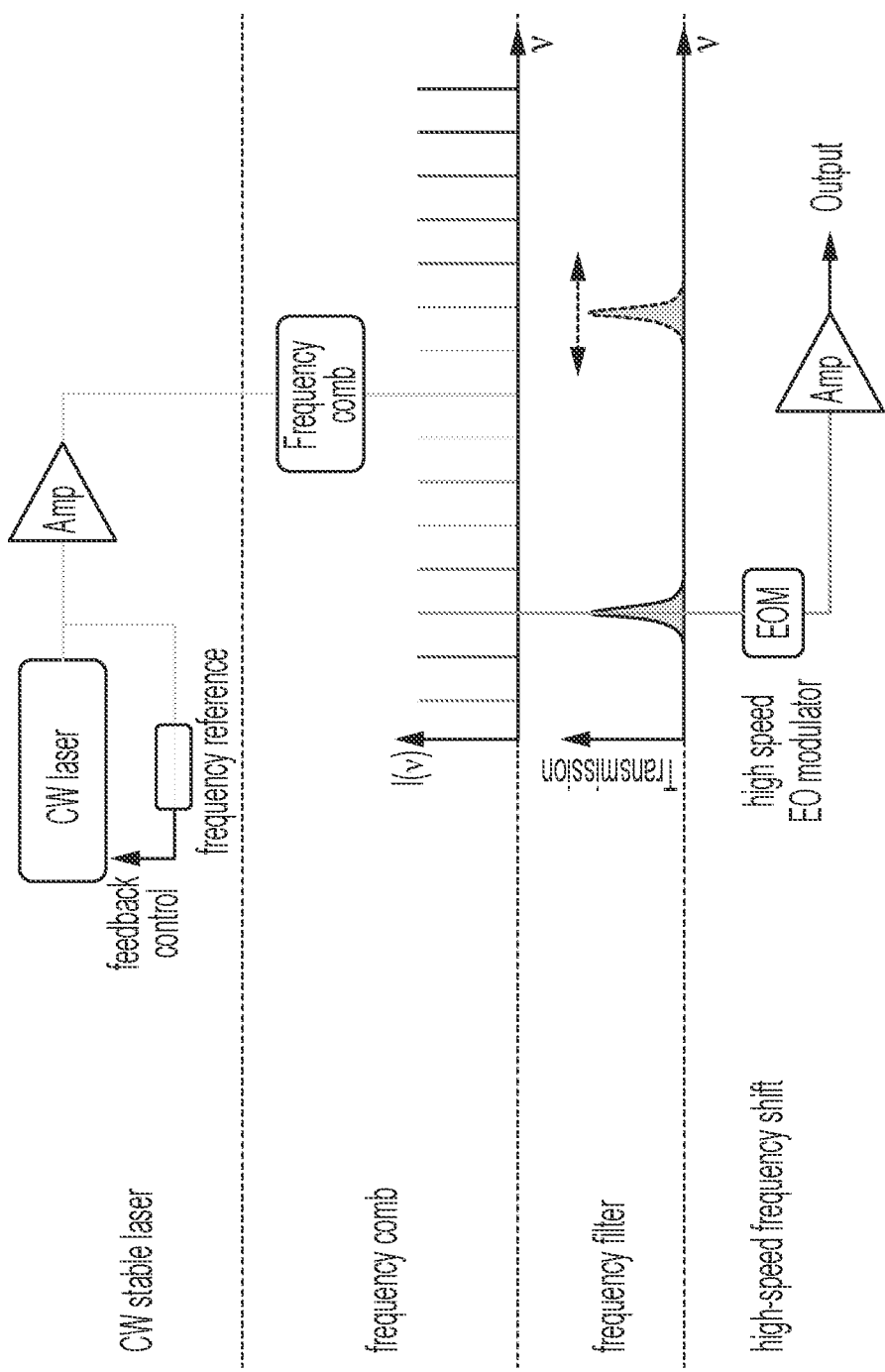
FIG. 4 is a schematic diagram of an example laser system that includes a continuous wave laser, a frequency comb, a frequency filter, and a fine-tuning element.

FIG. 4 presents an example of the laser system, which in this particular example, includes four components. The laser system includes a CW laser having a narrow linewidth. The CW laser is actively locked to a frequency reference. Moreover, the frequency (or wavelength) of the CW laser is fixed at a single value that, in many instances, does not change appreciably. Examples of the CW laser include semiconductor lasers, solid state lasers, and fiber lasers. The frequency reference is configured to provide an optical signal whose frequency is defined by a precise value. With modulation of the CW laser around the reference frequency, a feedback signal can be generated to stabilize the frequency of the CW laser to the frequency reference. Examples of the frequency reference include an optical wavelength meter, an atomic or molecular ensemble, or a stable Fabry-Perot cavity. An optical amplifier may be used if the output power of the CW laser is too low to generate sufficient optical power in the comb lines or if additional optical power is needed to lock the CW laser to the frequency reference.

The example laser system may also include a frequency comb. The output of the CW laser (or amplifier, if present) may be used to generate a frequency comb across a target wavelength spectrum with a comb tooth spacing of a few tens of GHz. The comb spacing can be less than or greater than this number. However, in many applications, it is beneficial to make the comb tooth spacing as large as possible (accounting for the availability of RF devices) in order to span the largest spectral range. In some instances, the tooth spacing may have an upper limit set by the capability of a fine-tuning element to continuously cover the range between the comb teeth. The fine-tuning element can, for example, fine-tune the output by one full comb spacing (or ±one half a comb spacing). In some variations, the frequency comb is generated through four-wave-mixing processes in a photonic crystal fiber, four-wave-mixing in a micro resonator (Kerr frequency comb), or by using electro-optic modulation.

The example laser system may additionally include a frequency filter. The frequency filter is configured to generate a selected comb tooth from the frequency comb. In certain cases, the output of the frequency comb is filtered so that only one comb tooth closest to the target frequency is output from the frequency filter. In cases where more than one output frequency is desired, the frequency filter is used to select a subset of comb teeth that are recombined at the output of the system. Thermal or piezo-electrically tuned fiber Bragg gratings or ring resonators may be used as optical bandpass filters to select the target comb tooth. Alternatively, the frequency filter can include an arrayed waveguide grating (AWG) optically coupled to an optical switch. The comb teeth of the frequency comb are diffracted into individual optical channels through the arrayed waveguide grating, and the optical switch chooses one or more optical channels closest to the target frequency.

The example laser system may also include a fine-tuning element (e.g., a high speed frequency shifter). For example, a high-speed electro-optic modulator can be applied to fine tune and quickly shift the selected comb tooth to the target frequency. Such shifting may also include scanning the selected comb tooth within a spectral bandwidth around the target frequency. Moreover, single sideband suppressed carrier (SSB-SC) modulation can be used so that a single frequency is output. In this case, the electro-optic modulator may be a Mach-Zehnder type of modulator. High bandwidth lithium niobate waveguide modulators can be used for a broad range of frequencies. An optical amplifier may, in some instances, be used to boost the power of the final output.

During operation, the CW laser may be kept locked to the frequency reference. Such locking can eliminate the process of wavelength tuning at the CW laser and may also eliminate the relocking process. The frequency comb can be generated across a few tens to a few hundreds of nanometers, which is far beyond the mode-hop-free tuning range of an ECDL. Alternatively, the CW laser may be stabilized by locking one of the comb teeth to the frequency reference, instead of the direct output of the CW laser. This type of locking expands the allowable wavelength range if no frequency reference exists that is close to the center of the desired wavelength range.

Figure 5:
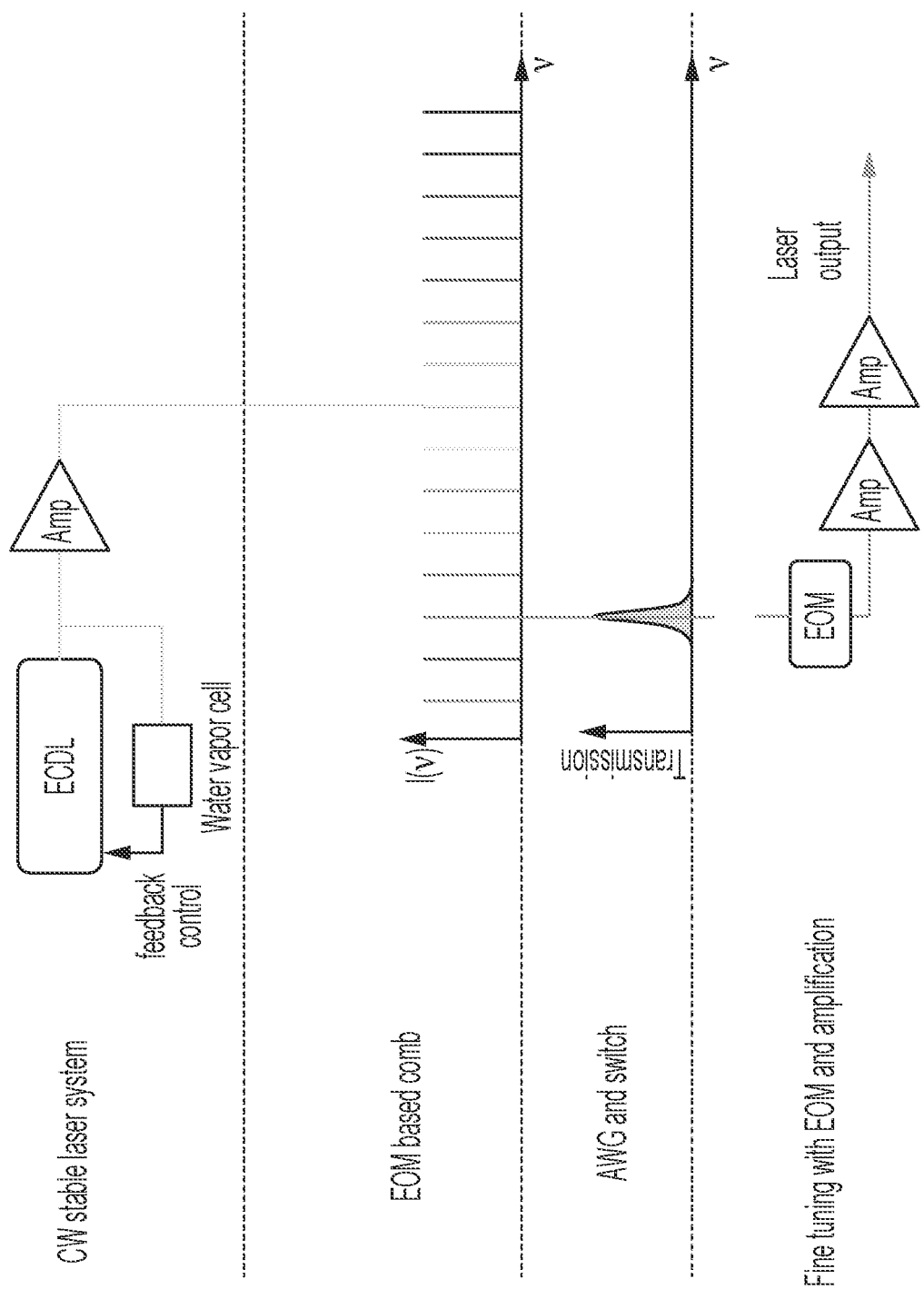
FIG. 5 is a schematic diagram of an example laser system that includes a frequency reference defined by a water vapor cell.

Now referring to FIG. 5, a schematic diagram is presented of an example laser system that includes a frequency reference defined by a water vapor cell. In some implementations, the example laser system is configured to produce light around 1455 nm and can tune over a 1560 GHz bandwidth. The switching time of the example laser system may be less than 10 µs, and the example laser system can be programmed to hop between different, precise (e.g., less than or equal to 1 MHz) frequencies.

Figure 6:
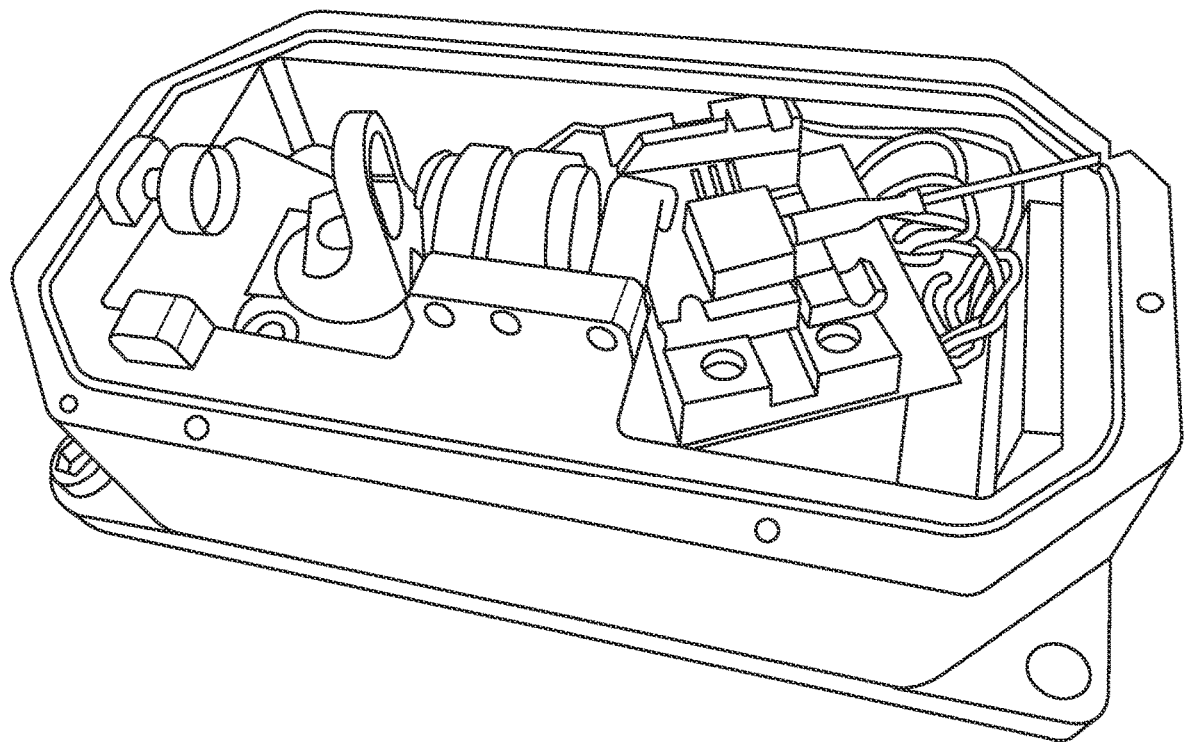
FIG. 6 is a line drawing of an example external cavity diode laser that includes a piezoelectrically-mounted mirror, a gain chip, and an angled optic that serves as an interference filter.
Figure 7:
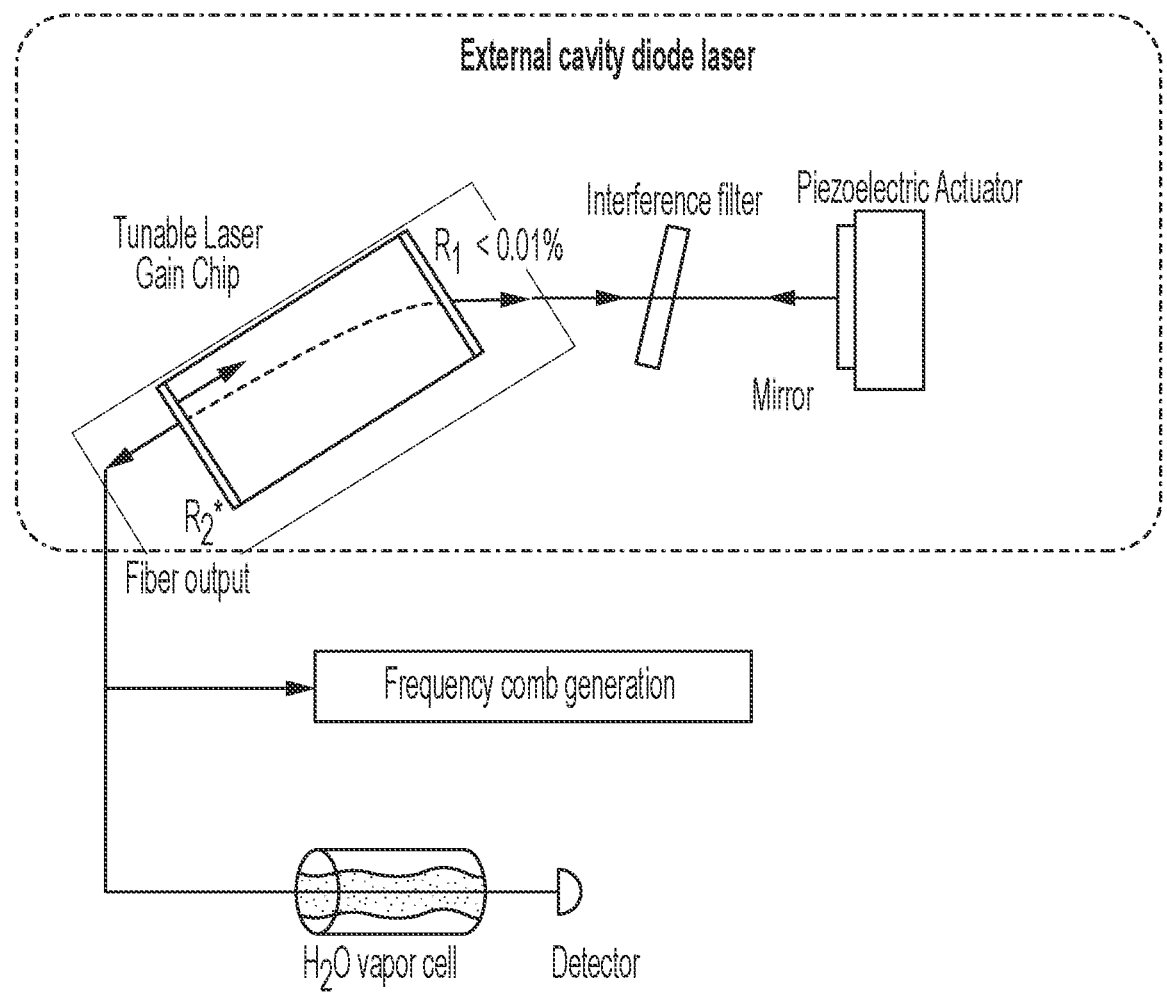
FIG. 7 is a schematic diagram of the example cavity diode laser of FIG. 6, showing an optical pathway that extends from the piezoelectrically-mounted mirror through the tunable laser gain chip and the angled optic.

The example laser system includes a CW laser that is constructed with a tunable laser gain chip and an external cavity diode laser (ECDL). For example, FIG. 6 presents a photograph of an example ECDL that includes a piezoelectrically-mounted mirror, a tunable laser gain chip, and an angled optic that serves as an interference filter. FIG. 7 presents a schematic diagram of the example ECDL of FIG. 6, showing an optical pathway that extends from the piezoelectrically-mounted mirror through the tunable laser gain chip and the angled optic. The wavelength of the ECDL is determined by the angle between the laser beam and the interference filter. The CW laser has a mirror mounted on a piezoelectric mount to control the cavity length for slow feedback (e.g., less than 5 kHz) while the gain chip current is controlled for faster feedback (e.g., less than 5 kHz). The CW laser output is around 30 mW. A semiconductor optical amplifier can be used to increase the output power of the ECDL so that it can be locked to the frequency reference and seed a high-power amplifier for frequency comb generation. The output wavelength is about 1455.5 nm. The ECDL can be locked directly to a Fabry-Perot cavity or an atomic or molecular spectral feature. In certain cases, the ECDL can also be offset locked so that it can be tuned to any frequency around the reference, which may include a tolerance of several hundred MHz to GHz depending on the reference.

The example laser system also includes a frequency reference whose transition line is defined by water vapor in a vapor cell. The example laser system can also include a single frequency Raman fiber amplifier that can produce power of about 5W. This amplifier is capable of amplifying an output of the example laser system to a power at or greater than 1 W. A frequency comb is generated by cascading the intensity of waveguide electro-optic and phase modulators with a comb tooth spacing of about 20 GHz. The waveguide electro-optic is based on a lithium niobate material (e.g., a single crystal of lithium niobate). The example laser system includes one intensity modulator and three phase modulators to generate at least 60 comb lines that span a frequency spectrum of more than 1200 GHz. In some variations, the intensity modulator is used to smooth the amplitude variations of the comb teeth relative to each other. However, in other variations, the inclusion of the intensity modulator is not necessary.

Figure 8:
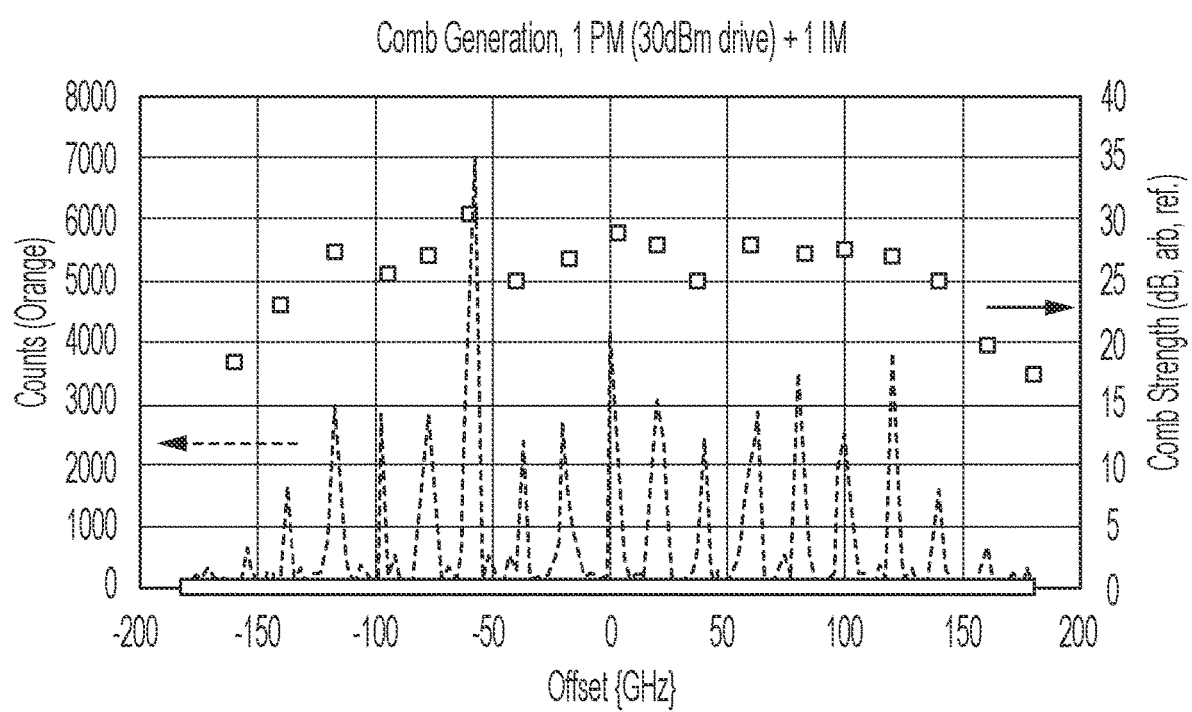
FIG. 8 is a graph of an example frequency comb produced by one intensity modulator and one phase modulator.

The example laser system may include other numbers of intensity modulators and phase modulators for generating the comb lines. For example, FIG. 8 presents a graph of an example frequency comb produced by one intensity modulator and one phase modulator. The example frequency comb includes eighteen individual teeth whose presence is indicated by blue squares in the graph. A magnitude of the teeth, in counts, is indicated by the left-side ordinate of the graph. Each additional phase modulator adds additional lines (e.g., the same number shown here for the power applied, roughly 1 Watt). An intensity modulator has been used to flatten an intensity across the example frequency comb so that there is not very much intensity variation between the comb teeth.

Figure 9:
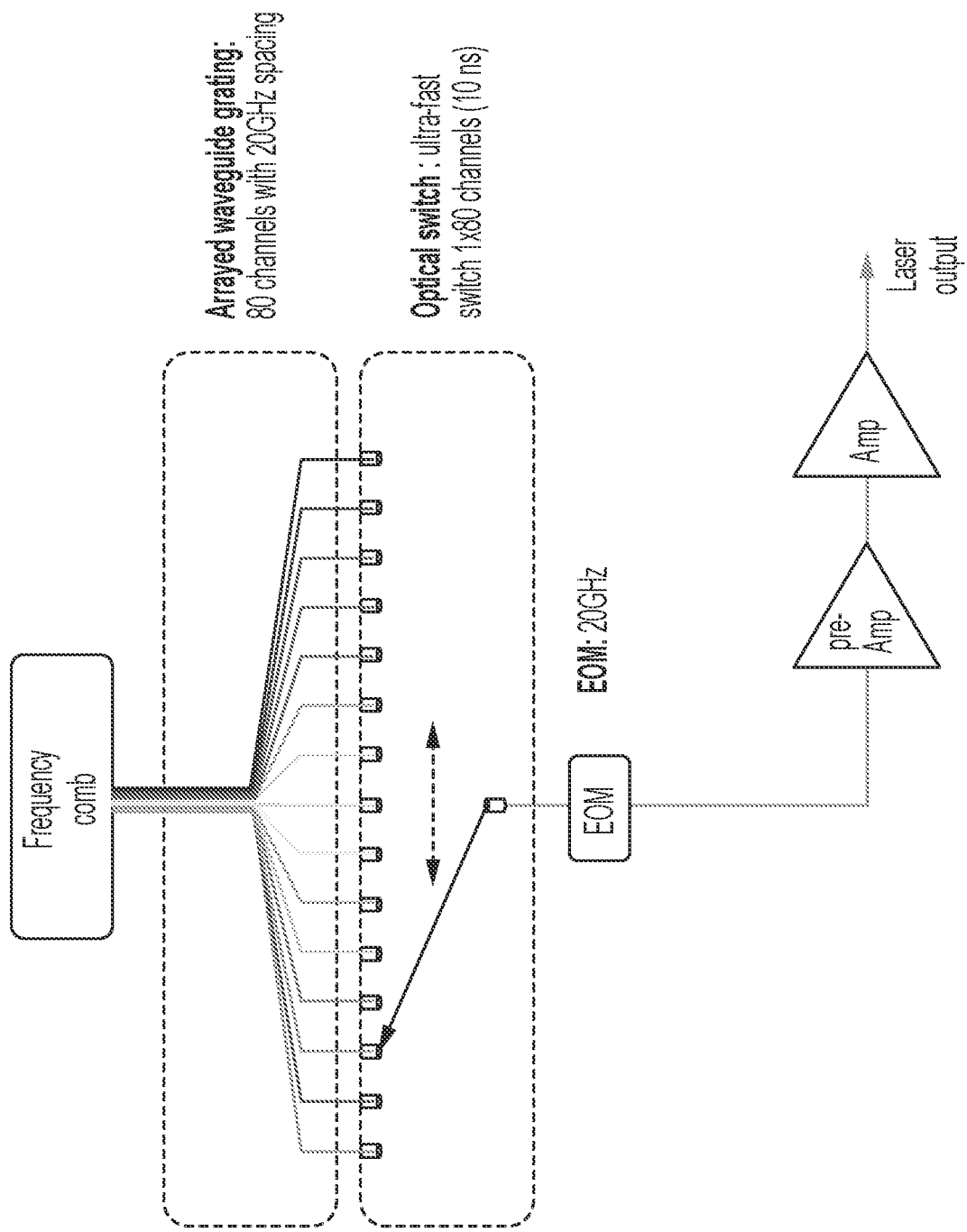
FIG. 9 is a schematic diagram of a portion of an example laser system that includes an 80-channel arrayed waveguide grating coupled to an optical switch.

The example laser system additionally includes an arrayed waveguide grating with 80 channels, an example of which, is shown in FIG. 9. The AWG is configured to diffract each comb tooth into an independent channel and provides a 1600 GHz span across the spectral band of interest. The output of the frequency comb is coupled, via a fiber optic cable, to the input of the AWG. Each of the 80 output channels of the AWG are coupled into the fiber optic cable. The center frequency of the AWG can be tuned with temperature. Moreover, the frequency comb can be aligned to the AWG transmission peaks. Such alignment can be achieved by combining the frequency comb with an offset lock of the ECDL, as well as by utilizing the electro-optically generated frequency comb to control the comb tooth spacing. The AWG may be used to allow the example laser system to have a band spacing of 19.4 GHz and a center frequency at 1455.191 nm.

The example laser system also includes an optical switch that incorporates PLZT-based electro-optic elements. The optical switch may, for example, be configured to have 1×80 channels, as shown in FIG. 9. Here, PLZT may refer to a class of transparent oxide materials represented by the composition $[Pb_{1-x}La_x][Zr_yTi_{1-y}]_{1-x/4}O_3$ (e.g., x=0.08 and y=0.65). The optical switch has a response time in the order of nanoseconds (e.g., less than 100 ns) and can switch among the output channels of the AWG so that a single channel is emitted from the optical switch. This fast electro-optic switch can be configured as a tree of sub-switches in which 80 frequency comb signals enter the switch and one selected frequency comb signal exists the switch. For example, one output can exit the switch by activating a select number of sub-switches. The output is fiber optically coupled to a fine tuning element, such as an electro-optic modulator (EOM). As such, the selected frequency comb signal can define a selected frequency signal for the fine-tuning element. In many variations, the switching time of the optical switch is less than 10 ns.

The example laser system includes a Mach-Zehnder IQ waveguide electro-optic modulator based on a lithium niobate material. This electro-optic modulator serves as the fine-tuning element and can be used to shift the frequency of the overall output of the example laser system to a target output frequency. For example, the selected comb tooth (or selected frequency signal) may be proximate the target frequency. The electro-optic modulator may be used to shift the frequency of the selected comb tooth to the target output frequency (e.g., an atomic or molecular transition). SSB-SC modulation can be used to suppress or eliminate undesired frequencies. The frequency switching can, in some instances, be limited by the relocking of the radio frequency oscillator.

The example laser system additionally includes one or more semiconductors and/or fiber optical amplifiers configured to boost the output power of the example laser system to at least 100 mW at the output of the fine-tuning element or example laser system. FIG. 9 depicts a pair of amplifiers arranged in series (e.g., a pre-amplifier and an amplifier). However, other arrangements are possible. For example, both amplifiers can be arranged in parallel. In this arrangement, both amplifiers are fiber coupled, on one side, to the output of the fine-tuning element, and on the other side, fiber coupled to each other to define an output of the example laser system.

The example laser system may further include a control system (e.g., a computer, a microprocessor, or another type of system) that is configured to control the operation of an FPGA. The FPGA may be part of the control system and may include a program to lock the ECDL. The FPGA may also include a program to control components of the example laser system, such as the optical switch. For example, the optical switch can be pre-programmed so that a series of output frequencies are generated. The fine-tuning element can also be pre-programmed such that optical signals therefrom have frequencies corresponding to each of the series of output frequencies. The fine-tuning element allows for a series of frequencies to be output with dwell times appropriate for each specific application. The control system can also be programmed to monitor environmental conditions of the example laser system, and in response, adapt the laser locking and fine-tuning parameters to the environmental conditions. In some implementations, a stabilized clock, GPS, or GPS-steered clock can be used to stabilize the spacing in the frequency comb as well as the fine-tuning frequencies. These latter frequencies may be RF frequencies generated by oscillators built into the example laser system and referenced to an ovenized (or thermally stabilized) crystal oscillator.

Figure 10:
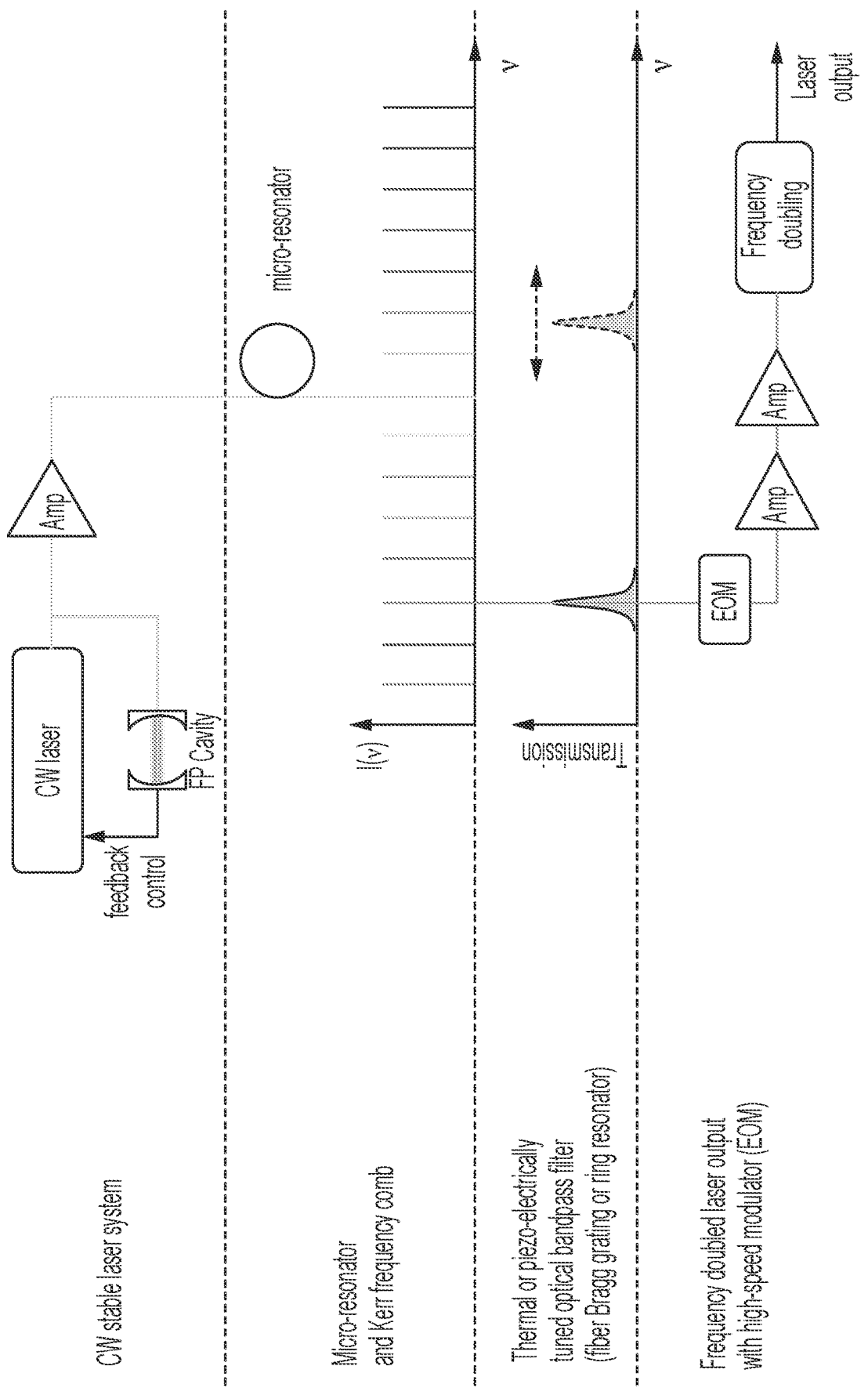
FIG. 10 is a schematic diagram of an example laser system that includes photonic integrated circuit elements for generating a frequency comb and filtering optical signals.

In some implementations, the laser system can include photonic integrated circuit elements. For example, FIG. 10 presents a schematic diagram of an example laser system that includes photonic integrated circuit elements for generating a frequency comb and filtering optical signals. The example laser system includes an ECDL locked to an Fabry-Perot cavity, which may define an ultra-stable optical cavity. Light at the output of the ECDL (which is part of the CW laser) is amplified and then frequency doubled, such as by a nonlinear optical crystal. Such doubling can be useful when manipulation of the optical signals by the frequency comb and optical switch is easier at infrared frequencies but a visible light output is desired. In some instances, the ECDL produces 1018-nm laser light that is amplified and frequency doubled to a 509-nm optical signals. This optical signal may provide a coupling laser wavelength that can be used for a vapor cell sensor (e.g., a two photon Rydberg atom sensor).

In some aspects of what is described, a laser system may be described by the following examples:

Example 1. A laser system, comprising:
  a laser configured to generate a laser signal;
  a frequency comb generator system configured to generate a frequency comb based on the laser signal, the frequency comb comprising frequency comb signals at respective comb frequencies;
  a frequency comb dispersion system configured to spatially separate the frequency comb signals onto respective optical channels of the frequency comb dispersion system;
  a frequency selector system configured to generate a selected frequency signal from the frequency comb signals after separation, the selected frequency signal comprising a target separated frequency comb signal; and
  a frequency shifter configured to alter the selected frequency signal toward a target output frequency of the laser system.

Example 2. The laser system of example 1, wherein the target separated frequency comb signal has a comb frequency that is closest to the target output frequency.

Example 3. The laser system of example 1, wherein the target separated frequency comb signal has a comb frequency that is second closest to the target output frequency.

Example 4. The laser system of example 1 or any one of examples 2-3, wherein the frequency shifter is configured to alter the selected frequency signal by fine-tuning the selected frequency signal to the target output frequency.

Example 5. The laser system of example 1 or any one of examples 2-4, wherein the frequency shifter is configured to alter the selected frequency signal by scanning the selected frequency signal about the target output frequency.

Example 6. The laser system of example 1 or any one of examples 2-5,
  wherein the laser is a continuous wave laser, and
  wherein the laser signal is a frequency locked output of the continuous wave laser.

Example 7. The laser system of example 6, comprising:
  a vapor cell having a vapor therein;
  wherein the frequency locked output is based on an electronic transition of the vapor.

Example 8. The laser system of example 6, comprising:
  an optical cavity having an optical path length;
  wherein the frequency locked output is based on the optical path length of the optical cavity.

Example 9. The laser system of example 1 or any one of examples 2-8, wherein the frequency comb dispersion system comprises an arrayed waveguide grating having:
  an input optical channel that receives the frequency comb signals from the frequency comb generator system; and
  a plurality of output optical channels that are physically separated from one another by a distance.

Example 10. The laser system of example 1 or any one of examples 2-9,
  wherein the frequency selector system comprises a network of optical switches; and
  wherein the laser system comprises a control system configured to control the network of optical switches to select a target optical channel that carries the target separated frequency comb signal.

Example 11. The laser system of example 1 or any one of examples 2-8 and 10, comprising a photonic integrated circuit that comprises a network of drop-out filters and defines the frequency comb dispersion system.

Example 12. The laser system of example 11, wherein the photonic integrated circuit further defines the frequency selector system.

Example 13. The laser system of example 11 or example 12, wherein the network of drop-out filters is defined by a plurality of ring resonators associated with respective frequency comb signals of the frequency comb, each ring resonator configured to resonate at a ring frequency when an optical path length of the ring resonator reaches a target optical path length, the ring frequency matching the comb frequency of one of the frequency comb signals.

Example 14. The laser system of example 1 or any one of examples 2-13, comprising one or more amplifiers that amplify the laser signal or amplify the selected frequency signal after being altered by the frequency shifter.

Example 15. The laser system of example 1 or any one of examples 2-14, wherein the frequency shifter comprises an optical modulator that performs single sideband suppressed carrier (SSB-SC) modulation.

Example 16. The laser system of example 1 or any one of examples 2-15, comprising a control system in communication with the frequency selector system and configured to perform operations that comprise:
  determining a difference between the target output frequency of the laser system and an updated target output frequency of the laser system; and
  transmitting a control signal to the frequency selector system to generate a second selected frequency signal, the control signal based on the difference.

Example 17. The laser system of example 1 or any one of examples 2-16,
  wherein the comb frequencies of the frequency comb signals are separated from each other by a common frequency spacing; and wherein the frequency shifter is configured to alter the selected frequency signal by a frequency magnitude no less than the common frequency spacing.

In some aspects of what is described, a method of tuning a laser system may be described by the following examples:

Example 18. A method of tuning an optical signal, the method comprising:
  generating a frequency comb having frequency comb signals at respective comb frequencies, the frequency comb based on a laser signal;
  spatially separating the frequency comb signals onto respective optical channels of the laser system;
  generating a selected frequency signal from the separated frequency comb signals, the selected frequency signal comprising a target separated frequency comb signal; and
  altering the selected frequency signal toward a target output frequency of the laser system.

Example 19. The method of example 18, wherein the target separated frequency comb signal has a comb frequency that is closest to the target output frequency.

Example 20. The method of example 18, wherein the target separated frequency comb signal has a comb frequency that is second closest to the target output frequency.

Example 21. The method of example 18 or any one of examples 19-20, wherein altering the selected frequency signal comprises fine-tuning the selected frequency signal to the target output frequency.

Example 22. The method of example 18 or any one of examples 19-21, wherein altering the selected frequency signal comprises scanning the selected frequency signal about the target output frequency.

Example 23. The method of example 18 or any one of examples 19-22, comprising:
  generating the laser signal by operation of a laser; and
  communicating the laser signal from the laser to a frequency comb generator system of the laser system, the frequency comb generator system operable to generate the frequency comb.

Example 24. The method of example 23, comprising one or both of:
  amplifying the laser signal; and
  amplifying the selected frequency signal after the selected frequency signal has been altered.

Example 25. The method of example 23 or example 24, wherein the laser is a continuous wave laser;
  wherein the laser signal is a frequency locked output of the continuous wave laser.

Example 26. The method of example 25, wherein the frequency locked output is based on an electronic transition of a vapor in a vapor cell.

Example 27. The method of example 25, wherein the frequency locked output is based on an optical path length of an optical cavity.

Example 28. The method of example 18 or any one of examples 19-27,
  wherein the laser system comprises an arrayed waveguide grating having an input optical channel and a plurality of output optical channels that are physically separated from one another by a distance; and
  wherein spatially separating the frequency comb signals comprises:
    receiving the frequency comb signals at the input optical channel of the arrayed waveguide grating,
    separating each frequency comb signal onto a distinct output optical channel of the arrayed waveguide grating, and
    communicating, from the plurality of output optical channels, respective frequency comb signals to a frequency selector system of the laser system, the frequency selector system operable to generate the selected frequency signal.

Example 29. The method of example 18 or any one of examples 19-28, comprising:
  wherein the laser system comprises:
    a network of optical switches, and
    a control system configured to control the network of optical switches; and
  wherein the method comprises selecting, by operation of the control system, a target optical channel that carries the target separated frequency comb signal.

Example 30. The method of example 18 or any one of examples 19-27 and 29, wherein the frequency comb signals are separated spatially onto respective optical channels by a photonic integrated circuit that comprises a network of drop-out filters.

Example 31. The method of example 30, wherein the selected frequency signal is generated by the photonic integrated circuit.

Example 32. The method of example 30 or example 31,
  wherein the network of drop-out filters corresponds to a plurality of ring resonators associated with respective frequency comb signals of the frequency comb; and
  wherein spatially separating the frequency comb signals comprises altering an optical path length of a ring resonator to a target optical path length, thereby causing the ring resonator to resonate at a ring frequency, the ring frequency matching the comb frequency of one of the frequency comb signals.

Example 33. The method of example 18 or any one of examples 19-32, wherein altering the selected frequency signal comprises modulating the selected frequency signal according to a single sideband suppressed carrier (SSB-SC) modulation.

Example 34. The method of example 18 or any one of examples 19-33,
  wherein the laser system comprises a frequency selector system that is operable to generate the selected frequency signal; and
  wherein the method comprises:
    determining, by operation of a control system, a difference between the target output frequency of the laser system and an updated target output frequency of the laser system, and
    transmitting, by operation of the control system, a control signal to the frequency selector system based on the difference.

Example 35. The method of example 34, comprising:
  generating, by operation of the frequency selector system, a second selected frequency signal based on the control signal.

Example 36. The method of example 18 or any one of examples 19-35,
  wherein the comb frequencies of the frequency comb signals are separated from each other by a common frequency spacing; and
  wherein altering the selected frequency signal comprises altering the selected frequency signal by a frequency magnitude no less than the common frequency spacing.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A laser system, comprising:
a laser configured to generate a laser signal;
a frequency comb generator system configured to generate a frequency comb based on the laser signal, the frequency comb comprising frequency comb signals at respective comb frequencies;
a frequency comb dispersion system configured to spatially separate the frequency comb signals onto respective optical channels of the frequency comb dispersion system;
a frequency selector system configured to generate a selected frequency signal from the frequency comb signals after separation, the selected frequency signal comprising a target separated frequency comb signal; and
a frequency shifter configured to alter the selected frequency signal toward a target output frequency of the laser system.

2. The laser system of claim 1, wherein the target separated frequency comb signal has a comb frequency that is closest to the target output frequency.

3. The laser system of claim 1, wherein the frequency shifter is configured to alter the selected frequency signal by fine-tuning the selected frequency signal to the target output frequency.

4. The laser system of claim 1, wherein the frequency shifter is configured to alter the selected frequency signal by scanning the selected frequency signal about the target output frequency.

5. The laser system of claim 1,
wherein the laser is a continuous wave laser, and
wherein the laser signal is a frequency locked output of the continuous wave laser.

6. The laser system of claim 5, comprising:
a vapor cell having a vapor therein;
wherein the frequency locked output is based on an electronic transition of the vapor.

7. The laser system of claim 5, comprising:
an optical cavity having an optical path length;
wherein the frequency locked output is based on the optical path length of the optical cavity.

8. The laser system of claim 1, wherein the frequency comb dispersion system comprises an arrayed waveguide grating having:
an input optical channel that receives the frequency comb signals from the frequency comb generator system; and
a plurality of output optical channels that are physically separated from one another by a distance.

9. The laser system of claim 1,
wherein the frequency selector system comprises a network of optical switches; and
wherein the laser system comprises a control system configured to control the network of optical switches to select a target optical channel that carries the target separated frequency comb signal.

10. The laser system of claim 1, comprising a photonic integrated circuit that comprises a network of drop-out filters and defines the frequency comb dispersion system.

11. The laser system of claim 10, wherein the photonic integrated circuit further defines the frequency selector system.

12. The laser system of claim 10, wherein the network of drop-out filters is defined by a plurality of ring resonators associated with respective frequency comb signals of the frequency comb, each ring resonator configured to resonate at a ring frequency when an optical path length of the ring resonator reaches a target optical path length, the ring frequency matching the comb frequency of one of the frequency comb signals.

13. The laser system of claim 1, wherein the frequency shifter comprises an optical modulator that performs single sideband suppressed carrier (SSB-SC) modulation.

14. The laser system of claim 1, comprising a control system in communication with the frequency selector system and configured to perform operations that comprise:
determining a difference between the target output frequency of the laser system and an updated target output frequency of the laser system; and
transmitting a control signal to the frequency selector system to generate a second selected frequency signal, the control signal based on the difference.

15. The laser system of claim 1,
wherein the comb frequencies of the frequency comb signals are separated from each other by a common frequency spacing; and
wherein the frequency shifter is configured to alter the selected frequency signal by a frequency magnitude no less than the common frequency spacing.

16. A method of tuning a laser system, the method comprising:
generating, by operation of a frequency comb generator system, a frequency comb having frequency comb signals at respective comb frequencies, the frequency comb based on a laser signal generated by a laser of the laser system;
spatially separating, by operation of a frequency comb dispersion system, the frequency comb signals onto respective optical channels of the frequency comb dispersion system;
generating, by operation of a frequency selector system, a selected frequency signal from the separated frequency comb signals, the selected frequency signal comprising a target separated frequency comb signal; and
altering, by operation of a frequency shifter, the selected frequency signal toward a target output frequency of the laser system.

17. The method of claim 16, wherein the target separated frequency comb signal has a comb frequency that is closest to the target output frequency.

18. The method of claim 16, wherein altering the selected frequency signal comprises fine-tuning the selected frequency signal to the target output frequency.

19. The method of claim 16, wherein altering the selected frequency signal comprises scanning the selected frequency signal about the target output frequency.

20. The method of claim 16, comprising:
generating the laser signal by operation of the laser; and
communicating the laser signal from the laser to the frequency comb generator system.

21. The method of claim 20,
wherein the laser is a continuous wave laser;
wherein the laser signal is a frequency locked output of the continuous wave laser; and
wherein the frequency locked output is based on an electronic transition of a vapor in a vapor cell.

22. The method of claim 20,
wherein the laser is a continuous wave laser;
wherein the laser signal is a frequency locked output of the continuous wave laser; and
wherein the frequency locked output is based on an optical path length of an optical cavity.

23. The method of claim 16,
wherein the frequency comb dispersion system comprises an arrayed waveguide grating having an input optical channel and a plurality of output optical channels that are physically separated from one another by a distance; and
wherein spatially separating the frequency comb signals comprises:
  receiving the frequency comb signals at the input optical channel of the arrayed waveguide grating,
  separating each frequency comb signal onto a distinct output optical channel of the arrayed waveguide grating, and
  communicating, from the plurality of output optical channels, respective frequency comb signals to the frequency selector system.

24. The method of claim 16,
wherein the frequency selector system comprises a network of optical switches;
wherein the laser system comprises a control system configured to control the network of optical switches; and
wherein the method comprises selecting, by operation of the control system, a target optical channel that carries the target separated frequency comb signal.

25. The method of claim 16, wherein the frequency comb signals are separated spatially onto respective optical channels by a photonic integrated circuit that comprises a network of drop-out filters, the photonic integrated circuit defining the frequency comb dispersion system.

26. The method of claim 25,
wherein the photonic integrated circuit further defines the frequency selector system; and
wherein the selected frequency signal is generated by the photonic integrated circuit.

27. The method of claim 25,
wherein the network of drop-out filters corresponds to a plurality of ring resonators associated with respective frequency comb signals of the frequency comb; and
wherein spatially separating the frequency comb signals comprises altering an optical path length of a ring resonator to a target optical path length, thereby causing the ring resonator to resonate at a ring frequency, the ring frequency matching the comb frequency of one of the frequency comb signals.

28. The method of claim 16, wherein altering the selected frequency signal comprises modulating the selected frequency signal according to a single sideband suppressed carrier (SSB-SC) modulation.

29. The method of claim 16, comprising:
determining, by operation of a control system, a difference between the target output frequency of the laser system and an updated target output frequency of the laser system,
transmitting, by operation of the control system, a control signal to the frequency selector system based on the difference, and
generating, by operation of the frequency selector system, a second selected frequency signal based on the control signal.

30. The method of claim 16,
wherein the comb frequencies of the frequency comb signals are separated from each other by a common frequency spacing; and
wherein altering the selected frequency signal comprises altering the selected frequency signal by a frequency magnitude no less than the common frequency spacing.

* * * * *

UNITED STATES PATENT AND TRADEMARK OFFICE
CERTIFICATE OF CORRECTION

PATENT NO. : 11,658,461 B1
APPLICATION NO. : 18/150110
DATED : May 23, 2023
INVENTOR(S) : Liu et al.

It is certified that error appears in the above-identified patent and that said Letters Patent is hereby corrected as shown below:

In the Specification

Column 2, Line 37 Delete "102." and insert -- 104. -- therefor

Column 4, Line 5 Delete "118" and insert -- 110 -- therefor

Column 4, Line 32 Delete "102," and insert -- 100, -- therefor

Column 5, Line 9 Delete "118)" and insert -- 110) -- therefor

Column 5, Line 30 Delete "118)" and insert -- 110) -- therefor

Column 6, Line 40 Delete "us" and insert -- µs -- therefor

Column 6, Line 40 Delete "us" and insert -- µs -- therefor

Column 11, Line 44 Delete "us" and insert -- µs -- therefor

Column 13, Line 33 Delete "SW." and insert -- 5W. -- therefor

Signed and Sealed this
First Day of August, 2023

Katherine Kelly Vidal
*Director of the United States Patent and Trademark Office*